United States Patent
Sasaki et al.

(10) Patent No.: US 7,880,564 B2
(45) Date of Patent: Feb. 1, 2011

(54) NOISE FILTER ARRAY

(75) Inventors: Tomohiro Sasaki, Fukui (JP); Kenjiro Hadano, Sabae (JP); Haruhiko Ueno, Sabae (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/358,318

(22) Filed: Jan. 23, 2009

(65) Prior Publication Data

US 2009/0121806 A1 May 14, 2009

Related U.S. Application Data

(63) Continuation of application No. PCT/JP2007/063991, filed on Jul. 13, 2007.

(30) Foreign Application Priority Data

| Jul. 27, 2006 | (JP) | ................... 2006-205296 |
| Jun. 11, 2007 | (JP) | ................... 2007-153777 |

(51) Int. Cl.
  *H03H 7/00* (2006.01)
(52) U.S. Cl. .................. 333/185; 333/168
(58) Field of Classification Search .............. 333/132, 333/168, 172, 181–185
  See application file for complete search history.

(56) References Cited

U.S. PATENT DOCUMENTS

| 1,636,737 A * | 7/1927 | Dietze ............... 333/168 |
| 5,197,170 A * | 3/1993 | Senda et al. ........ 29/25.42 |
| 5,304,967 A | 4/1994 | Hayashi |
| 5,583,470 A * | 12/1996 | Okubo ............... 333/185 |
| 6,097,268 A | 8/2000 | Watanabe et al. |
| 6,147,573 A * | 11/2000 | Kumagai et al. ..... 333/185 |
| 6,661,312 B2 * | 12/2003 | Orihara ............. 333/185 |

FOREIGN PATENT DOCUMENTS

| EP | 0 523 241 A1 | 1/1993 |
| JP | 07-010914 U | 2/1995 |
| JP | 09-266430 A | 10/1997 |
| JP | 2001-118728 A | 4/2001 |
| JP | 2005-050973 A | 2/2005 |
| JP | 2005-064267 A | 3/2005 |
| JP | 2005-294637 A | 10/2005 |
| WO | 92/14275 A1 | 8/1992 |

OTHER PUBLICATIONS

Official Communication issued in International Patent Application No. PCT/JP2007/063991, mailed on Oct. 30, 2007.
Hadano et al.; "Noise Filter Array"; U.S. Appl. No. 12/352,027, filed Jan. 12, 2009.

* cited by examiner

*Primary Examiner*—Robert Pascal
*Assistant Examiner*—Kimberly E Glenn
(74) *Attorney, Agent, or Firm*—Keating & Bennett, LLP

(57) ABSTRACT

A noise filter array includes filter elements including an LC parallel resonant circuit and an LC series resonant circuit each of which includes a coil and a capacitor provided in proximity in an array and integrally provided with one another. The LC series resonant circuits include ground capacitors having signal-side electrodes. Inductance adjustment conductors are connected to signal-side electrodes of the capacitors defining the respective filter elements, and a ground electrode of the capacitors is commonly arranged so as to oppose the signal-side electrodes.

23 Claims, 16 Drawing Sheets

NOISE FILTER ARRAY

BACKGROUND OF THE INVENTION

1. Field of the Invention

The present invention relates to a noise filter array in which multiple filter elements are integrally provided with one another. Each filter element includes an LC parallel resonant circuit and an LC series resonant circuit each including a coil and a capacitor.

2. Description of the Related Art

Since various communication methods (for example, Global System for Mobile Communications (GSM), Digital Cellular System (DCS), and Personal Communications service (PCS)) are used for mobile phones, some conventional mobile phones use multiple communication bands. In such a case, in order to prevent the reception sensitivity within each communication band from being degraded, it is necessary to effectively suppress noise within each communication band.

In the noise suppression within communication bands near, for example, about 900 MHz and near about 1.8 GHz, noise filters are required to achieve attenuation over a wide range across the communication bands. In order to achieve such wide attenuation characteristics in filters, an inductance can be applied to grounded capacitors to define double-resonance filters.

In the related art, a double-resonance filter element shown in FIG. 10 is known (see, for example, Japanese Unexamined Patent Application Publication No. 9-266430). The double-resonance filter element in FIG. 10 includes an LC parallel resonant circuit PR in which a stray capacitor C1 is provided in parallel with a coil L1 provided on a signal line and an LC series resonant circuit SR in which a capacitor C2 is serially connected to a coil L2 between the signal line and the ground.

Although such a double-resonance filter element in the related art provides attenuation over a wide bandwidth, specifically, although such a double-resonance filter element can suppress the noise within each communication band near about 900 MHz or near about 1.8 GHz in the above example of the mobile phones, in practice, it is difficult to effectively suppress the noises within the communication bands using only one double-resonance filter element in a mobile phone using multiple communication bands.

Accordingly, multiple double-resonance filter elements corresponding to the multiple communication bands can be provided, and these filter elements can be integrally provided with one another to configure a noise filter array. The noise filter array in which the multiple double-resonance filter elements are integrally provided with one another has an array configuration as shown in FIG. 11. The array configuration in FIG. 11 is represented as an equivalent circuit. Four filter elements are provided in the exemplary noise filter array shown in FIG. 11.

In the array configuration shown in FIG. 11, since all of the portions corresponding to LC series resonant circuits surrounded by broken lines are grounded, the capacitors and the coils may be shared to provide a simple configuration. In such a case, for example, a noise filter array has a configuration shown in FIG. 12.

Specifically, in the noise filter array in FIG. 12, the signal-side electrodes of ground capacitors C12 to C42 including the LC series resonant circuits in the filter elements are provided for the respective filter elements while the capacitors C12 to C42 have a ground-side electrode commonly provided for the signal-side electrodes and one coil L0 is connected to the ground-side electrodes.

However, since only one coil L0 is commonly used in the LC series resonant circuits in the filter elements in the noise filter array having the configuration shown in FIG. 12, it is difficult to individually adjust the inductances of the LC series resonant circuits for each communication band. Consequently, there is a problem in that it is not possible to appropriately accommodate cases in which the filter elements are provided to suppress noises having different frequencies.

SUMMARY OF THE INVENTION

To overcome the problems described above, preferred embodiments of the present invention provide a noise filter array capable of individually adjusting the inductances of LC series resonant circuits in multiple filter elements and capable of effectively suppressing the noises within multiple communication bands without requiring a complicated configuration.

A noise filter array according to a preferred embodiment of the present invention includes a plurality of filter elements arranged in an array and integrally provided with one another. Each filter element includes an LC parallel resonant circuit and an LC series resonant circuit each including a coil and a capacitor. The noise filter array includes an inductance adjustment conductor that is connected to the signal-side electrode of a ground capacitor of each LC series resonant circuit and the capacitors include a ground electrode that is commonly arranged for the signal-side electrodes so as to oppose the signal-side electrodes.

Preferably, the inductances of the inductance adjustment conductors are individually set in accordance with a signal frequency within a communication band.

Preferably, each of the inductance adjustment conductors has one of a meander shape, a spiral shape, or a coil shape.

Preferably, each of the inductance adjustment conductors is connected to the signal-side electrode of the capacitor through a via hole.

Preferably, the inductance adjustment conductor and the signal-side electrode of the capacitor, which define the LC series resonant circuit, are integrally provided on substantially the same plane.

According to a preferred embodiment of the present invention, the noise filter array preferably has a layered configuration in which the filter elements are provided on both sides in the layering direction of the ground electrode, which is commonly provided for the signal-side electrodes of the capacitors.

According to another preferred embodiment of the present invention, the noise filter array preferably has a layered configuration in which two elements among the filter elements are provided on one side of the ground electrode of the capacitors in the layering direction and two elements among the filter elements are provided on the other side of the ground electrode of the capacitors in the layering direction.

According to another preferred embodiment of the present invention, the noise filter array preferably has a layered configuration in which the filter elements are provided on only one side of the ground electrode of the capacitors in the layering direction.

The locations of the conductors of the coil defining the LC parallel resonant circuit and the LC series resonant circuit are shifted so that the conductors are not overlapped with one another in the thickness direction.

A noise filter array according to another preferred embodiment of the present invention includes a plurality of filter elements provided in an array and integrally provided with one another. Each filter element includes a coil in which a plurality of insulating layers having coil conductors provided thereon are layered and a capacitor in which an insulating layer having a signal-side electrode provided thereon and an insulating layer having a ground electrode formed thereon are layered. The coil is arranged in proximity to the capacitor in the layering direction and the coil is electrically connected to the capacitor. In the noise filter array, the plurality of filter elements are arranged along the layering direction and the plurality of filter elements arranged along the layering direction are overlapped with one another such that the coils are adjacent to one another and the capacitors are arranged on at least one external side in the layering direction so as not to be sandwiched between the coils.

Preferably, an even number of the filter elements are arranged along the layering direction, approximately half of the filter elements are arranged in the upper side in the layering direction and approximately the other half of the filter elements are arranged in the lower side in the layering direction so as to have a substantially symmetrical configuration in the layering direction.

Preferably, the capacitors of the filter elements along the layering direction are collectively arranged on one side of the coils in the layering direction.

Preferably, the ground electrodes of the capacitors are shared between the filter elements and are arranged so as to cover an area in which the coils are provided.

Preferably, of adjacent coils of each filter element, the coil near the capacitors is configured so as to have a winding length of the coil conductors greater than that of the other coil.

Preferably, the capacitors are arranged outside in the layering direction at a mounting surface side.

Preferably, a directional identification mark is preferably provided on the outermost insulating layer in the layering direction.

According to a preferred embodiment of the present invention, it is possible to easily provide the noise filter array in which the multiple LC parallel resonant circuits and the multiple LC series resonant circuits each including a coil and a capacitor are integrally provided with one another without requiring a complicated configuration. In addition, when each filter element includes the LC parallel resonant circuit and the LC series resonant circuit and the LC series resonant circuit includes a ground capacitor and an inductance adjustment conductor, it is possible to easily provide the noise filter array that includes the multiple double-resonance filter elements.

Furthermore, since the inductance adjustment conductor is connected to the signal-side electrode of the ground capacitor defining each filter element, the inductances of the series resonant circuits can be adjusted for each filter element. Accordingly, the use of the noise filter according to a preferred embodiment of the present invention enables the noise within each communication band to be effectively suppressed, for example, even when one mobile phone uses multiple communication bands.

When the inductances of the inductance adjustment conductors are individually set in accordance with the signal frequency of the communication band, the noise included in a signal within each communication band can be effectively suppressed.

Configuring each of the inductance adjustment conductors in one of a meander shape, a spiral shape, or a coil shape as in the noise filter array according to a preferred embodiment of the present invention described above, enables the inductances to be easily adjusted. In addition, it is possible to reduce the variation in plating thickness of the formed conductors when the inductance adjustment conductors are formed by plating.

When each of the inductance adjustment conductors is connected to the signal-side electrode of the capacitor through the via hole, multiple inductance adjustment conductors may be layered, as required. Accordingly, it is possible to increase the inductances of the LC series resonant circuits and to decrease the frequency of the resonant circuits.

When the inductance adjustment conductor and the signal-side electrode of the capacitor, which define the LC series resonant circuit, are integrally provided on substantially the same plane, it is possible to connect the inductance adjustment conductor to the signal-side electrode of the capacitor without the via hole. Consequently, it is possible to decrease the required number of insulating sheets so as to reduce the cost.

When the noise filter array has a layered configuration in which the filter elements are provided on both sides in the layering direction of the ground electrode, which is commonly provided for the signal-side electrodes, it is possible to suppress the magnetic effect between the upper filter elements and the lower filter elements with the ground electrode sandwiched therebetween to reduce a variation in the response point of each filter element.

When two elements among the filter elements are provided on one side of the ground electrode of the capacitors in the layering direction and two elements among the filter elements are provided on the other side of the ground electrode of the capacitors in the layering direction, the noise filter array can be configured to include the four elements.

When the number of filter elements is relatively small, the filter elements may be provided on only one side in the layering direction of the ground electrode commonly provided for the signal-side electrodes. With this configuration, it is possible to decrease the thickness of the components of the noise filter.

When the locations of conductors of the coil defining the LC parallel resonant circuit and the LC series resonant circuit are shifted so that the conductors are not overlapped with one another in the thickness direction, the thickness of the components of the noise filter is made substantially uniform. As a result, the internal stress during manufacturing is reduced and it is possible to prevent the occurrence of cracks between the conductors on adjacent layers, thus improving the yield of the product.

In the noise filter array according to a preferred embodiment of the present invention, the multiple filter elements arranged along the layering direction are overlapped with one another such that the coils are adjacent to one another and the capacitors are arranged on at least one external side in the layering direction so as not to be sandwiched between the coils. Accordingly, gas from a binder can be easily discharged during degreasing and firing of the capacitors, and therefore, delamination can be effectively prevented. Delamination is a phenomenon in which the insulating sheets are separated from one another. In addition, since the capacitors are provided outside the coils, an occurrence of breakage of the coils can be suppressed or prevented even if a crack occurs due to shock, for example, when the circuit board on which the noise filter array is mounted is dropped.

When an even number of the filter elements are arranged along the layering direction, substantially half of the filter elements are arranged in the upper side in the layering direction, and substantially the other half of the filter elements are arranged in the lower side in the layering direction so as to achieve a substantially symmetrical configuration in the layering direction, the variation in characteristics between the filter elements is reduced, thus reducing the variation in insertion loss characteristics.

When the capacitors of the filter elements along the layering direction are collectively arranged on one side of the coils, the discharge of the gas from the binder in the firing of the capacitors is facilitated so as to prevent delamination. In addition, the breakage of the coils can be suppressed or prevented even if a crack occurs due to, for example, shock after the mounting of the noise filter array.

When the ground electrodes of the capacitors are shared between the filter elements and are arranged so as to cover the area in which the coils are provided, the stray capacitance between the coils and the external electrodes toward the ground can be suppressed, thus reducing the variation in the IL characteristics.

When, of adjacent coils of each filter element, the coil near the capacitors is arranged so as to have a winding length of the coil conductors greater than that of the other coil, the variation in the inductance can be reduced between the filter elements even when the capacitors are collectively arranged on one side of the coils.

One side of the coils on which the capacitors are collectively arranged can be set as the mounting surface side to avoid an occurrence of a fatal error, such as the breakage of the coils, even if a crack occurs due to, for example, shock.

The directional identification mark is preferably provided on the outermost insulating layer in the layering direction because the mounting surface on which the capacitors are provided can be easily identified, for example, when the capacitors are collectively arranged on one side of the coils.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described with reference to the drawings.

First Preferred Embodiment

Figure 1:
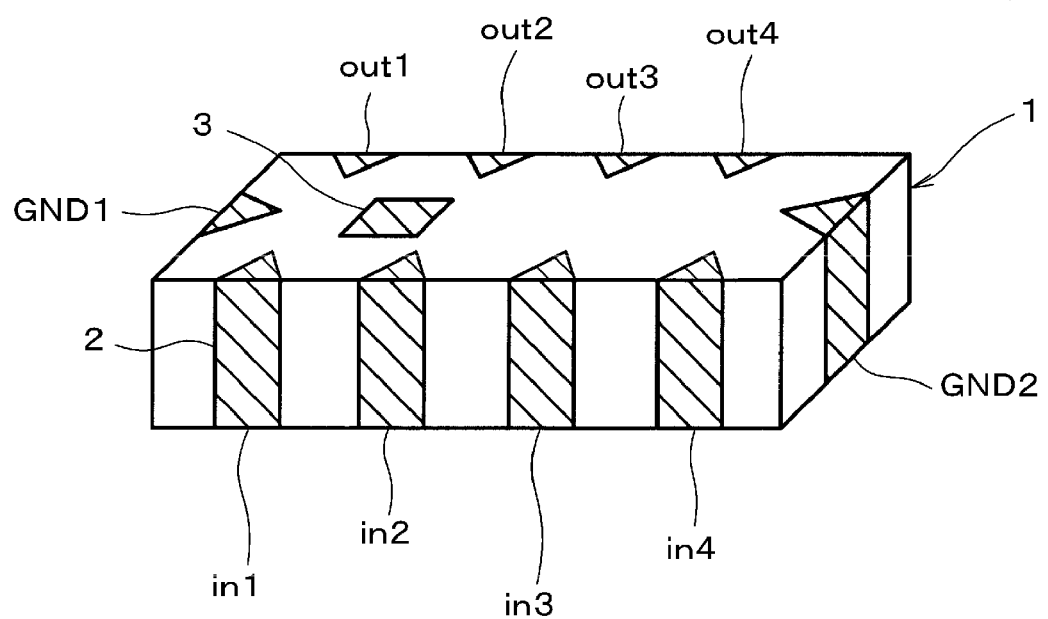
FIG. 1 is a perspective view showing a noise filter array according to a first preferred embodiment of the present invention.
Figure 2:
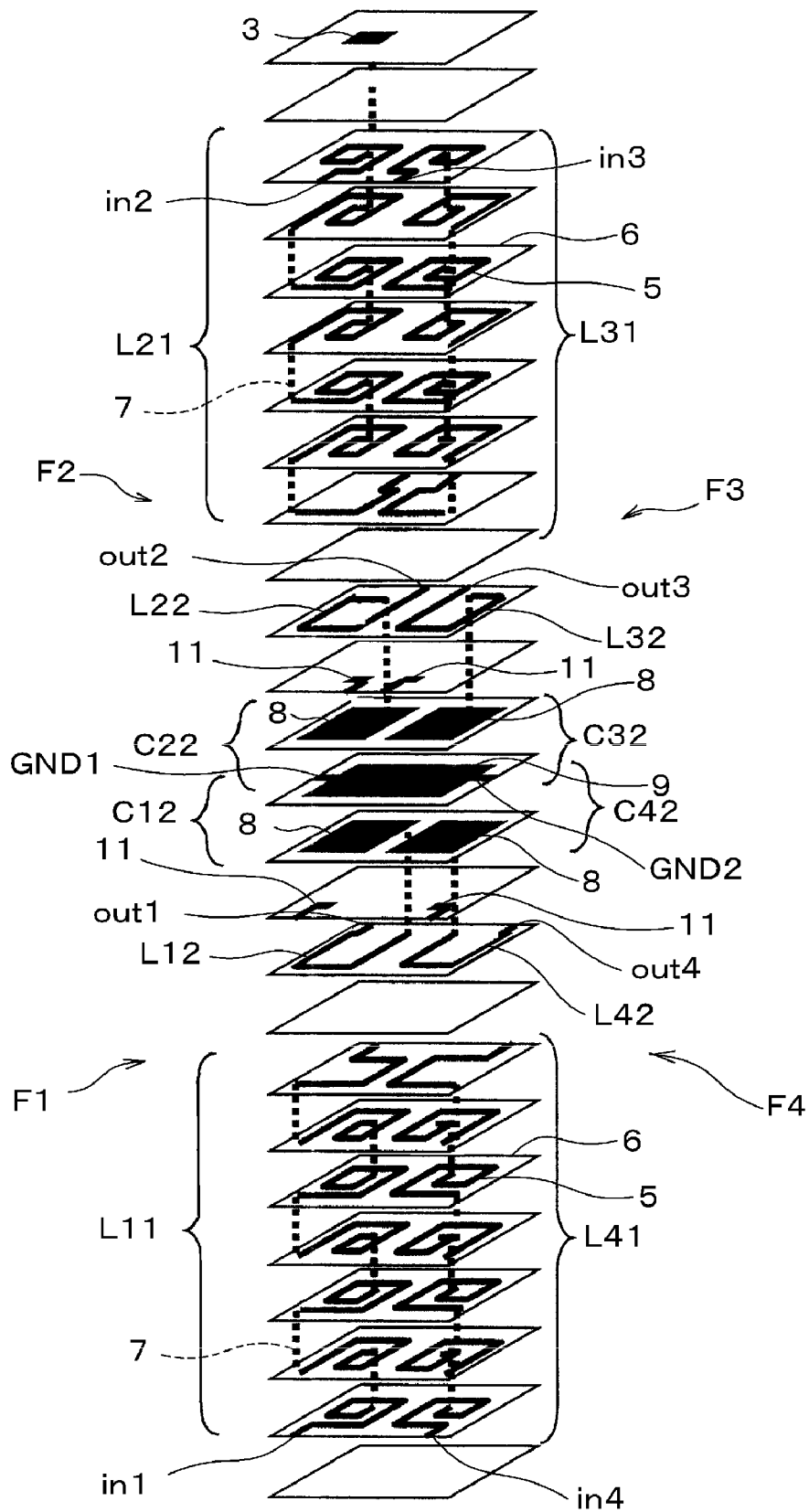
FIG. 2 is an exploded perspective view of the noise filter array according to the first preferred embodiment of the present invention.
Figure 3:
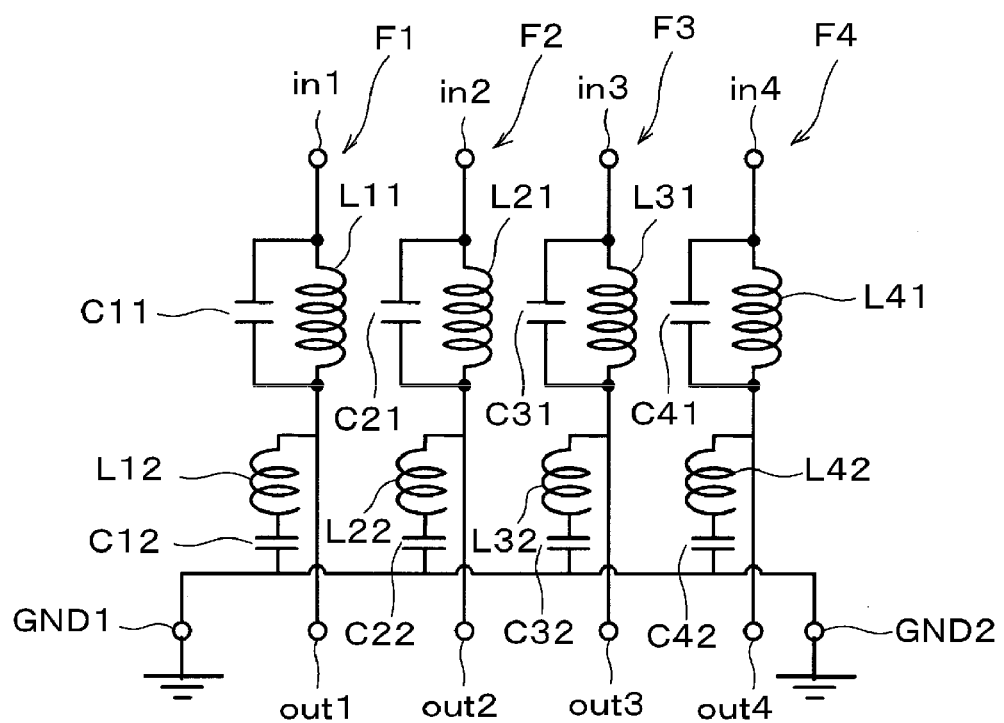
FIG. 3 is an electrical equivalent circuit diagram of the noise filter array according to the first preferred embodiment of the present invention.
Figure 4:
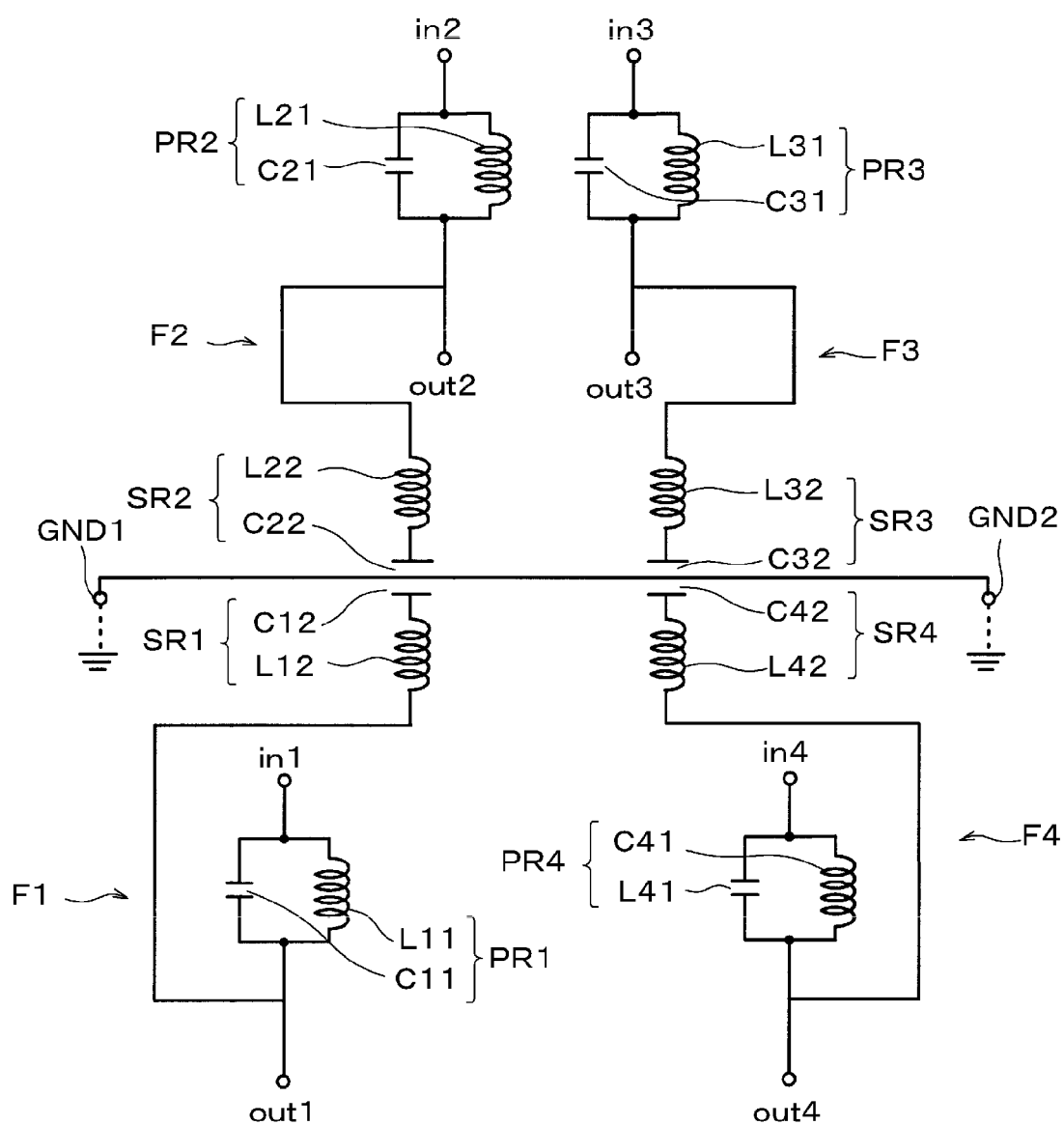
FIG. 4 is an electrical equivalent circuit diagram resulting from a rearrangement of the electrical equivalent circuit diagram in FIG. 3 so that the electrical equivalent circuit diagram corresponds to the exploded perspective view in FIG. 2.

FIG. 1 is a perspective view showing a noise filter array according to a first preferred embodiment of the present invention. FIG. 2 is an exploded perspective view of the noise filter array. FIG. 3 is an electrical equivalent circuit diagram of the noise filter array. FIG. 4 is an electrical equivalent circuit diagram resulting from a rearrangement of the electrical equivalent circuit diagram in FIG. 3 so that the electrical equivalent circuit diagram corresponds to the exploded perspective view in FIG. 2. The noise filter array of the first preferred embodiment will now be described with reference to FIGS. 1 to 4.

The noise filter array of the first preferred embodiment preferably has a substantially rectangular parallelepiped multilayer body 1 in which substantially rectangular insulating sheets preferably made of a ceramic dielectric material, such as barium titanate, for example, or a ceramic magnetic material, such as ferrite, for example, are layered and are integrally fired. External electrodes 2 are provided on the side surfaces of the multilayer body 1. The external electrodes 2 provided on the front and rear surfaces along the longer sides are preferably input terminals in1 to in4 and output terminals out1 to out4. The external electrodes 2 on the left-side and right-side surfaces along the shorter sides are preferably ground terminals GND1 and GND2.

In addition, a directional identification mark 3 is provided at a location displaced from the approximate center of the top surface of the multilayer body 1.

In the multilayer body 1, four double-resonance filter elements F1 to F4, for example, are integrally provided with one another so as to correspond to the four input terminals in1 to in4 and the four output terminals out1 to out4. Two elements in the filter elements F1 to F4 are arranged on one side of the multilayer body 1 in the thickness direction (i.e., the layering direction) and the remaining two elements in the filter elements F1 to F4 are arranged on the other side thereof in the thickness direction (the layering direction) with a ground-side electrode 9 described below sandwiched between the two elements on one side and the two elements on the other side. In other words, two filter elements F2 and F3 are provided in parallel in the direction substantially perpendicular to the thickness direction above the ground electrode 9 and the remaining two filter elements F1 and F4 are provided in parallel in the direction substantially perpendicular to the thickness direction below the ground electrode 9.

The filter elements F1 to F4 include LC parallel resonant circuits PR1 to PR4 and LC series resonant circuits SR1 to SR4, respectively.

In each of the LC parallel resonant circuits PR1 to PR4, a plurality of insulating sheets 6 on which spiral coil conductors 5 are provided are stacked. The LC parallel resonant circuits PR1 to PR4 include substantially helical coils L11 to and stray capacitors C11 to C41, respectively. The coils L11 to L41 are formed by electrically connecting the coil conductors 5 on the layers via via holes 7. The stray capacitors C11 to C41 are provided by the stray capacitances that inherently accompany the formation of the coils. One sides of the coil conductors 5 defining the coils L11 to L41 are connected to the external electrodes 2 defining the input terminals in1 to in4, and the other sides of the coil conductors 5 defining the coils L11 to L41 are connected to the external electrodes 2 defining the output terminals out1 to out4 of the multilayer body 1.

The locations of the respective coil conductors 5 defining the coils L11 to L41 of the LC parallel resonant circuits PR1 to PR4 are shifted so that the coil conductors 5 are not overlapped with one another in the thickness direction. Accordingly, the thickness of the multilayer body 1 is substantially uniform. As a result, the internal stress during the manufacture of the multilayer body 1 is reduced and it is possible to prevent an occurrence of a crack between the coil conductors 5 on adjacent layers, thus improving the yield of the product.

In contrast, the LC series resonant circuits SR1 to SR4 include inductance adjustment conductors L12 to L42 defining inductance coils and ground capacitors C12 to C42, respectively. The inductance adjustment conductors L12 to L42 and the ground capacitors C12 to C42 are provided on the insulating sheets 6.

Each of the inductance adjustment conductors L12 to L42 preferably has a substantial meander shape, such that the inductance adjustment conductors L12 to L42 have different lengths for the filter elements F1 to F4 in order to achieve a desired inductance in each of the filter elements F1 to F4. The shape of the inductance adjustment conductors L12 to L42 is not limited to the meander shape. Alternatively, each of the inductance adjustment conductors L12 to L42 may have a substantial spiral shape or in a substantial coil shape.

One end of each of the inductance adjustment conductors L12 to L42 extends out toward the distal end of the insulating sheet 6 to be connected to the external electrode 2 forming each of the output terminals out1 to out4. The other end of each of the inductance adjustment conductors L12 to L42 is electrically connected to a signal-side electrode 8 of each of the ground capacitors C12 to C42 through the via hole 7.

In contrast, the ground capacitors C12 to C42 are arranged such that the signal-side electrodes 8 provided on the insulating sheets 6 oppose the ground electrode 9 provided on the insulating sheet 6 via the insulating sheets 6. The signal-side electrodes 8 are provided for the respective inductance adjustment conductors L12 to L42 whereas the ground electrode 9 is commonly provided for the signal-side electrodes 8 so as to oppose the signal-side electrodes 8.

The signal-side electrodes 8 are electrically connected to the inductance adjustment conductors L12 to L42 through the via holes 7 as described above. The ground electrode 9 extends out toward the left-side and right-side ends of the insulating sheet 6 to be connected to the external electrodes 2 forming the ground terminals GND1 and GND2.

The directional identification mark 3 is provided to identify the mounting direction of the noise filter array on a circuit board and is electrically connected to the coil conductors 5 through the via hole 7. The directional identification mark 3 is electrically connected to the coil conductors 5 in order to ensure the plating adherence when the directional identification mark 3 is formed by electroplating.

The noise filter array of the first preferred embodiment includes stray capacitance adjustment conductors 11 to adjust the stray capacitances of the stray capacitors C11 to C41 defining the respective LC parallel resonant circuits PR1 to PR4. The stray capacitance adjustment conductors 11 are provided on the insulating sheets 6 arranged between the respective inductance adjustment conductors L12 to L42 and the signal-side electrodes 8 of the respective capacitors C12 to C42.

In the manufacture of the noise filter array having the above-described configuration, a conductive paste preferably including Ag, Pd, Cu, Au, or their alloy as a conductive component, for example, is applied to each insulating sheet 6 by, for example, screen printing to form the coil conductors 5, the inductance adjustment conductors L12 to L42, the signal-side electrodes 8 and the ground electrode 9 of the ground capacitors C12 to C42, the stray capacitance adjustment conductors 11, and the directional identification mark 3 on the insulating sheets 6. The via holes 7 are formed by forming through holes preferably using, for example, laser beams and filling the through holes with the conductive paste preferably including Ag, Pd, Cu, Au, or their alloy as a conductive component, for example.

The insulating sheets 6 on which the conductors, the electrodes, the via holes, and other elements are formed in the manner shown in FIG. 2 are layered and are subjected to pressure bonding to manufacture the multilayer body 1. Then, after the external electrodes 2 defining the input terminals in1 to in4, the output terminals out1 to out4, and the ground terminals GND1 and GND2 are formed on the side surfaces of the multilayer body 1, the multilayer body 1 is fired. After the multilayer body 1 is fired, the surface of each of the external electrodes 2 is preferably plated with Ni or Sn, for example. As a result, the substantially rectangular parallelepiped noise filter array having the configuration shown in FIG. 1 is manufactured.

As described above, the inductance adjustment conductors L12 to L42 are provided in the LC series resonant circuits SR1 to SR4 in the double-resonance filter elements F1 to F4, respectively, in the noise filter array of the first preferred embodiment. Accordingly, the shape of the conductors L12 to L42 can be changed in the manufacture of the noise filter array to finely adjust the inductances of the filter elements F1 to F4 individually. As a result, it is possible to easily adjust the frequency of each of the filter elements F1 to F4.

Consequently, it is possible to effectively suppress the noise within each communication band even when one mobile phone uses multiple communication bands.

Since the ground electrode 9 of the capacitors C12 to C42 is commonly provided for the signal-side electrodes 8 in the noise filter array of the first preferred embodiment, the inductances can be adjusted regardless of the distance from the capacitors C12 to C42 to the ground terminals GND1 and GND2.

In addition, the two filter elements F2 and F3 are arranged on one side of the ground electrode 9 of the capacitors C12 to C42 in the thickness direction (the layering direction) and the remaining two filter elements F1 and F4 are arranged on the other side of the ground electrode 9 of the capacitors C12 to C42 in the thickness direction (the layering direction) in the noise filter array of the first preferred embodiment. Accordingly, a magnetic effect is unlikely to occur between the upper filter elements F2 and F3 and the lower filter elements F1 and F4 with the ground electrode 9 sandwiched therebetween.

Figure 5:
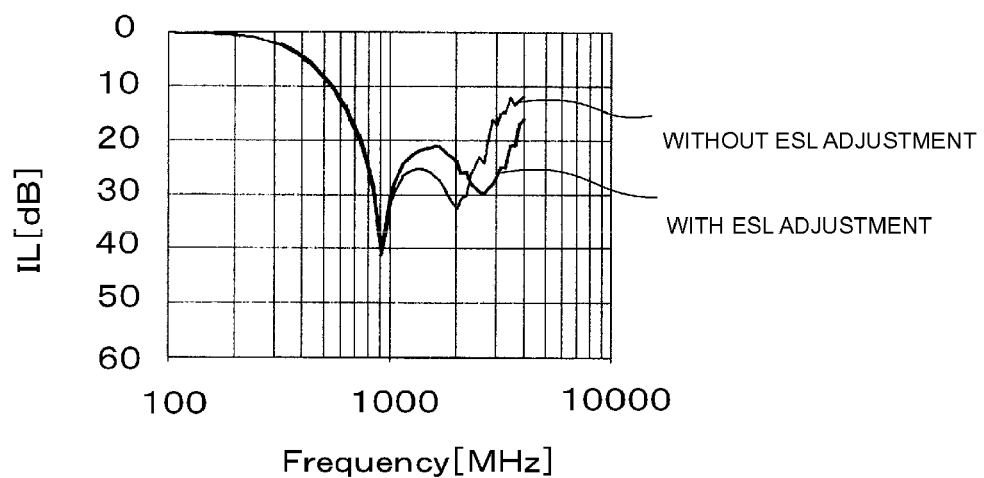
FIG. 5 is a characteristics diagram showing examples of the results of a measurement of the insertion loss characteristics with insertion of inductance adjustment conductors and without insertion of the inductance adjustment conductors in the noise filter array having the configuration of the first preferred embodiment of the present invention.

FIG. 5 is a characteristics diagram showing examples of the results of a measurement of the insertion loss characteristics with adjustment of the inductance (equivalent series inductance: ESL) by the inductance adjustment conductors L12 to L42 and without adjustment of the inductance (ESL) thereby.

As shown in FIG. 5, the insertion of the inductance adjustment conductors L12 to L42 enables the series resonant (second resonant) frequency of each filter element to be adjusted to a desired frequency (about 2 GHz in this example).

Figure 6:
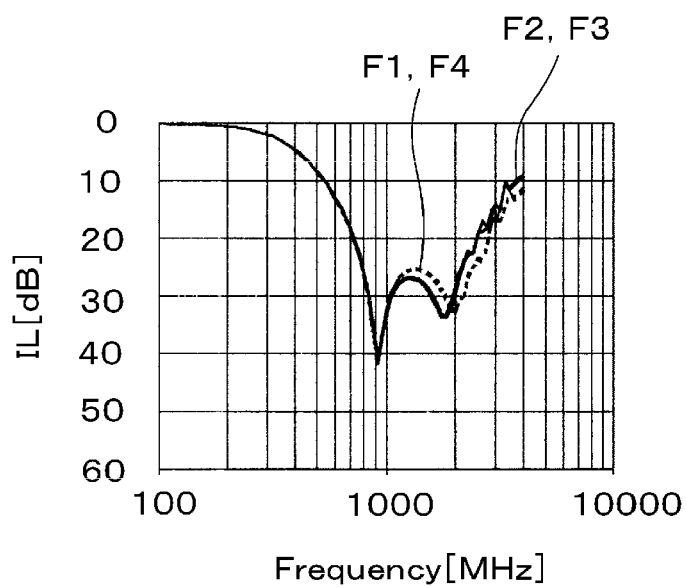
FIG. 6 is a characteristics diagram showing the results of a measurement of the insertion loss characteristics when the series resonant (second resonant) frequency near 1,800 MHz for the upper filter elements with respect to a ground electrode is different from that for the lower filter elements with respect to the ground electrode in the noise filter array having the configuration of the first preferred embodiment of the present invention.

FIG. 6 is a characteristics diagram showing the results of a measurement of the insertion loss characteristics when the series resonant (second resonant) frequency near 1,800 MHz for the upper filter elements F2 and F3 is different from that for the lower filter elements F1 and F4 with the ground electrode 9 sandwiched between the upper filter elements F2 and F3 and the lower filter elements F1 and F4. The two filter elements F2 and F3 horizontally arranged in parallel in FIGS. 2 and 4 are adjusted in advance so as to have substantially the same inductance, and the two filter elements F1 and F4 horizontally arranged in parallel in FIGS. 2 and 4 are adjusted in advance so as to have substantially the same inductance. Accordingly, two lines including a solid line (F2 and F3) and a broken line (F1 and F4) are shown in the diagram in FIG. 6.

As shown in FIG. 6, it is possible to easily adjust the inductances with the inductance adjustment conductors L12 to L42 having different shapes even if the filter elements F1 to F4 are configured to suppress noises of different frequencies.

Second Preferred Embodiment

Figure 7:
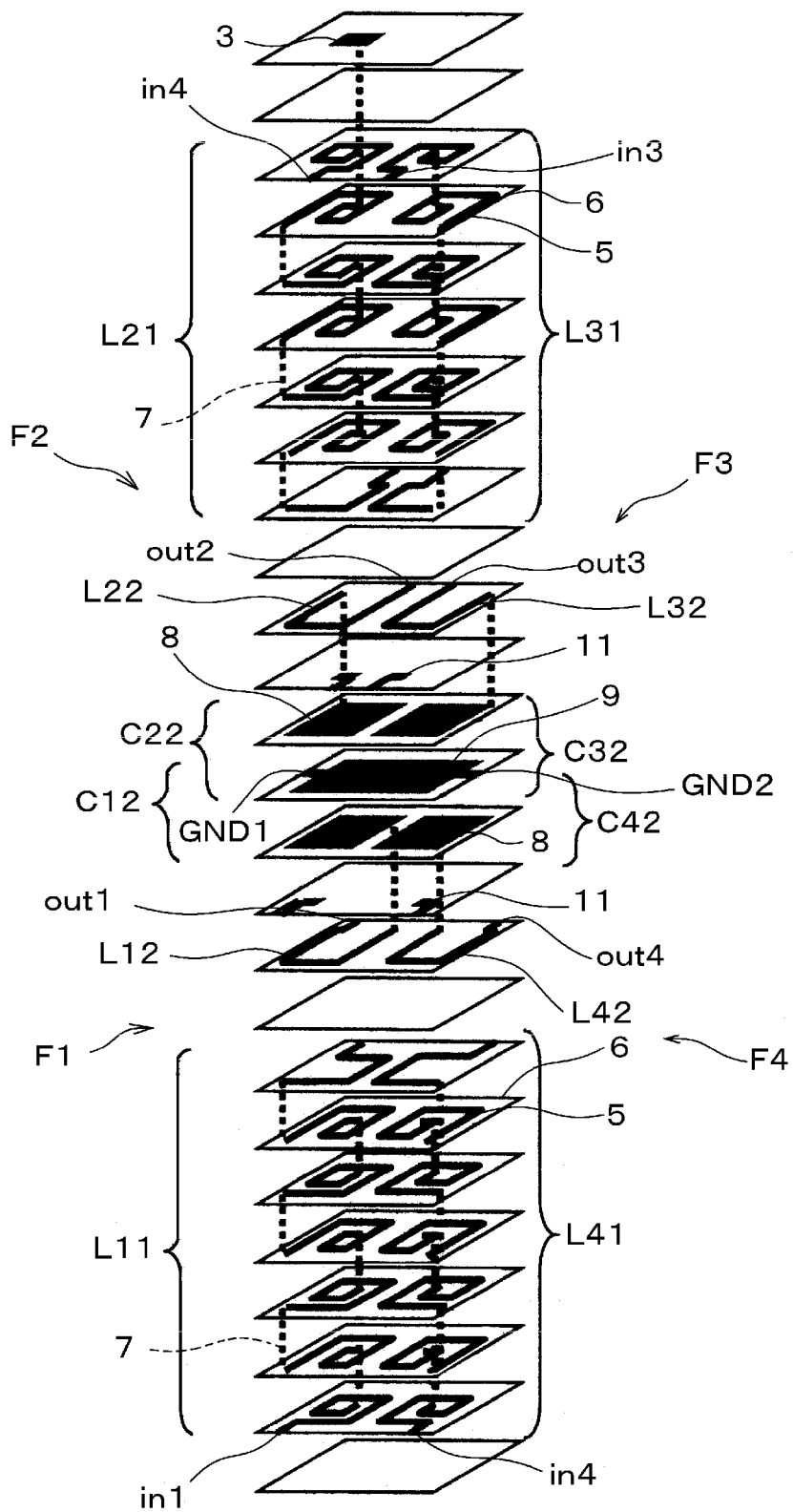
FIG. 7 is an exploded perspective view of a noise filter array according to a second preferred embodiment of the present invention.

FIG. 7 is an exploded perspective view of a noise filter array according to a second preferred embodiment of the present invention. The components in FIG. 7 having the same reference numerals as those in FIGS. 1 to 4 show the same components as in the configuration of the first preferred embodiment or show the corresponding components of the first preferred embodiment.

In the noise filter array of the second preferred embodiment, the inductance adjustment conductors L12 to L42 are configured so as to have approximately the same shape so that the LC series resonant circuits SR1 to SR4 in the filter elements F1 to F4 have substantially the same inductance. Also in the second preferred embodiment, the two filter elements F2 and F3 are integrally provided on one side of the ground electrode 9 in the thickness direction (the layering direction) and the remaining two filter elements F1 and F4 are integrally provided on the other side of the ground electrode 9 in the thickness direction (the layering direction), as in the first preferred embodiment.

Since the inductance adjustment conductors L12 to L42 are also provided in the respective filter elements F1 to F4 in the noise filter array of the second preferred embodiment, the shape of the inductance adjustment conductors L12 to L42 can be changed in the manufacture of the noise filter array to individually adjust the inductances of the LC series resonant circuits SR1 to SR4 in the filter elements F1 to F4. In other words, the resonance points of the filter elements, which are shifted due to magnetic coupling between the filter elements F2 and F3 or between the filter elements F1 and F4, can be finely adjusted for each filter element, so that variations in characteristics between the filter elements F1 to F4 are reduced.

Figure 8:
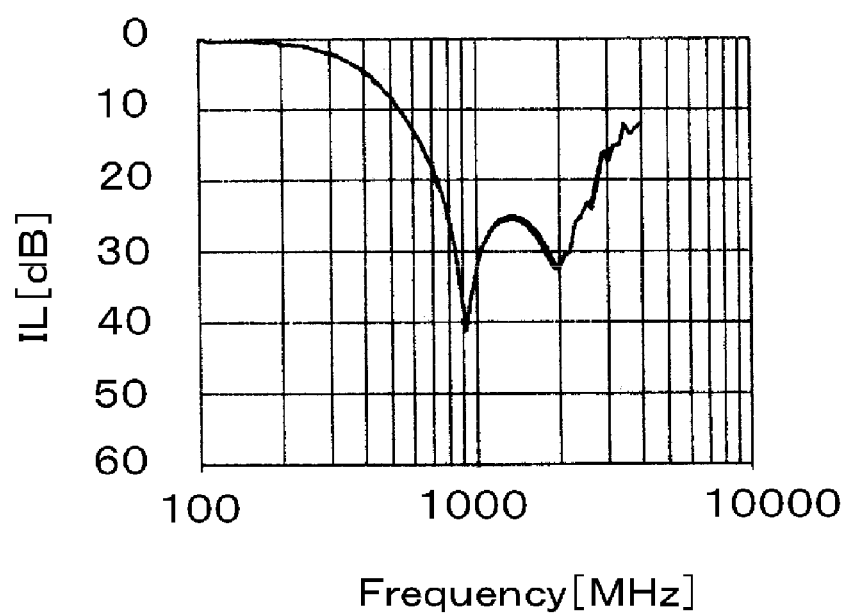
FIG. 8 is a characteristics diagram showing the results of a measurement of the insertion loss characteristics of the filter elements when inductance adjustment conductors provided in the respective filter elements are adjusted so as to have the same inductance in the second preferred embodiment of the present invention.

FIG. 8 is a characteristics diagram showing the results of a measurement of the insertion loss characteristics of the filter elements when the inductance adjustment conductors L12 to L42 provided in the respective filter elements F1 to F4 are adjusted so as to have substantially the same inductance.

As shown in FIG. 8, when the inductances of the LC series resonant circuits SR1 to SR4 in the filter elements F1 to F4 are individually adjusted, the filter elements F1 to F4 have approximately the same insertion loss. Accordingly, the characteristics of the filter elements F1 to F4 are represented by one solid line in FIG. 8. This shows that there is no substantial difference in the characteristics of the series resonant (second resonant) frequency between the filter elements.

Since the remaining configuration, advantages, and effects are similar to those in the first preferred embodiment shown in FIGS. 1 to 4, a detailed description of them is omitted herein.

Third Preferred Embodiment

Figure 9:
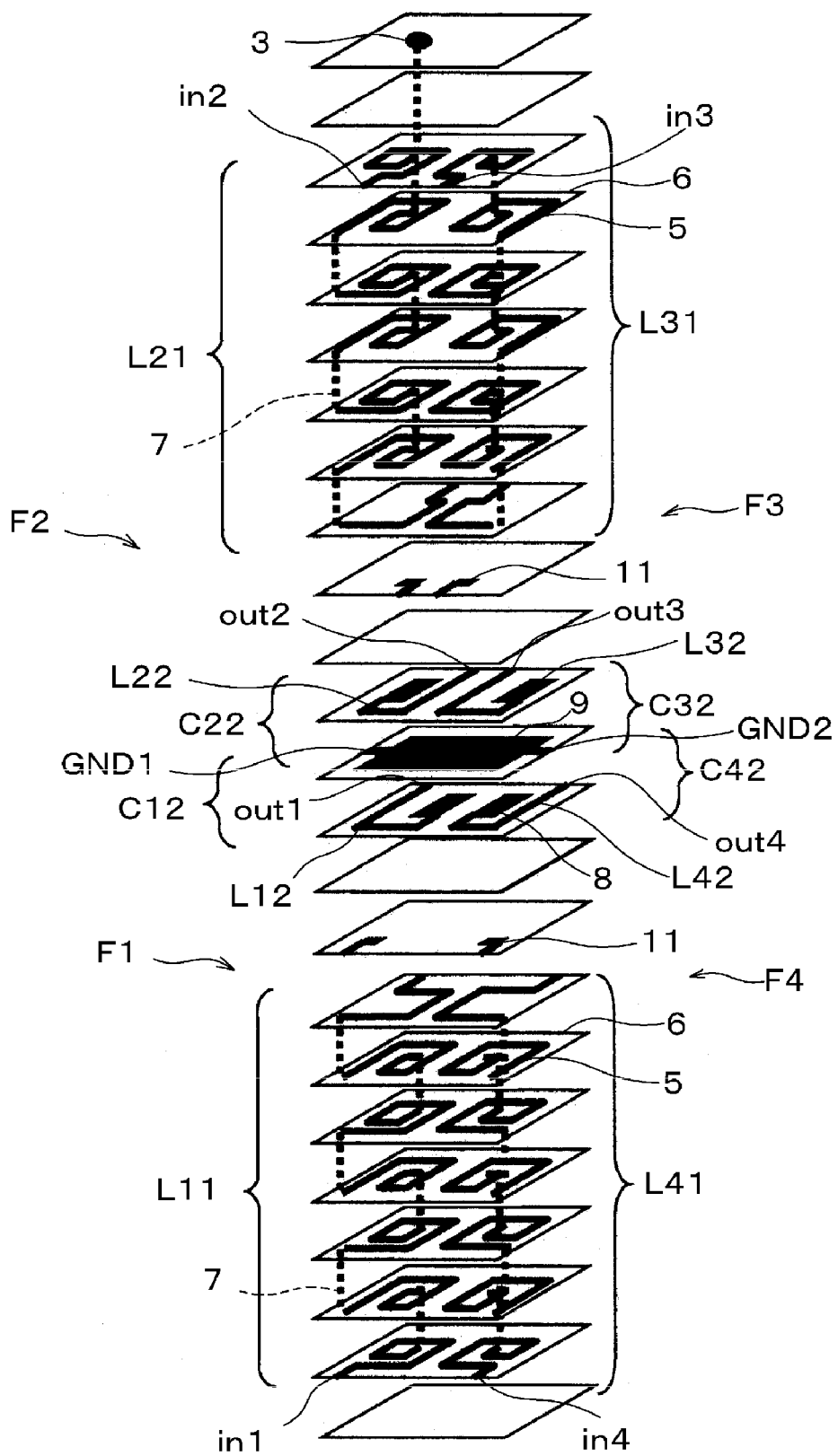
FIG. 9 is an exploded perspective view of a noise filter array according to a third preferred embodiment of the present invention.
Figure 10:
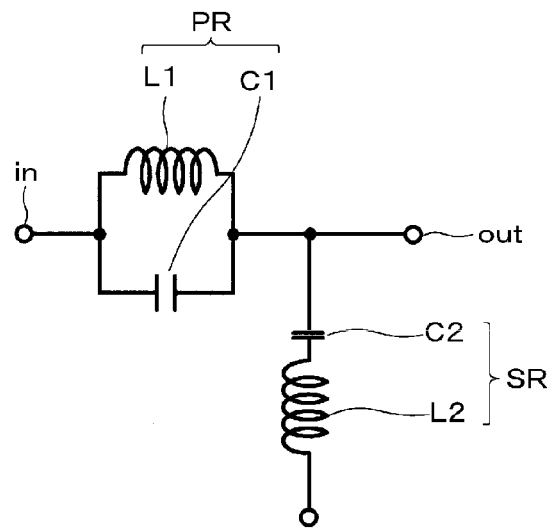
FIG. 10 is an electrical equivalent circuit diagram of a double-resonance filter element including an LC parallel resonant circuit and an LC series resonant circuit in related art.
Figure 11:
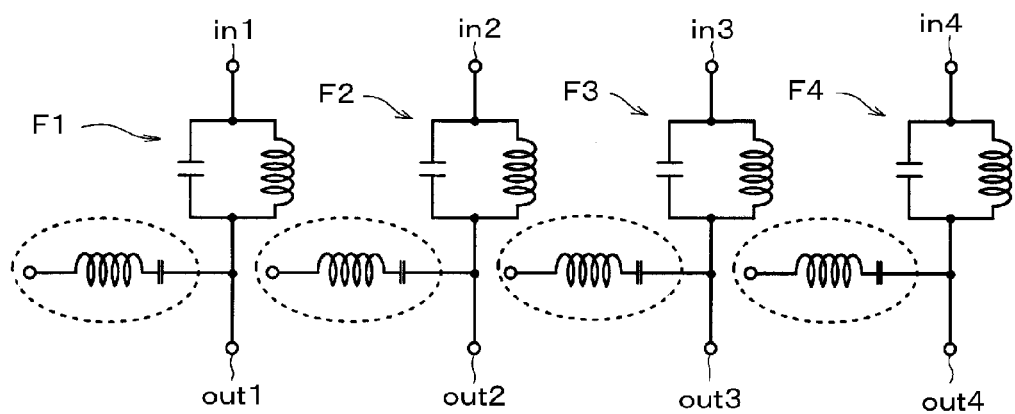
FIG. 11 is an electrical equivalent circuit diagram showing an example in which four double-resonance filter elements are arranged in an array form in the related art.
Figure 12:
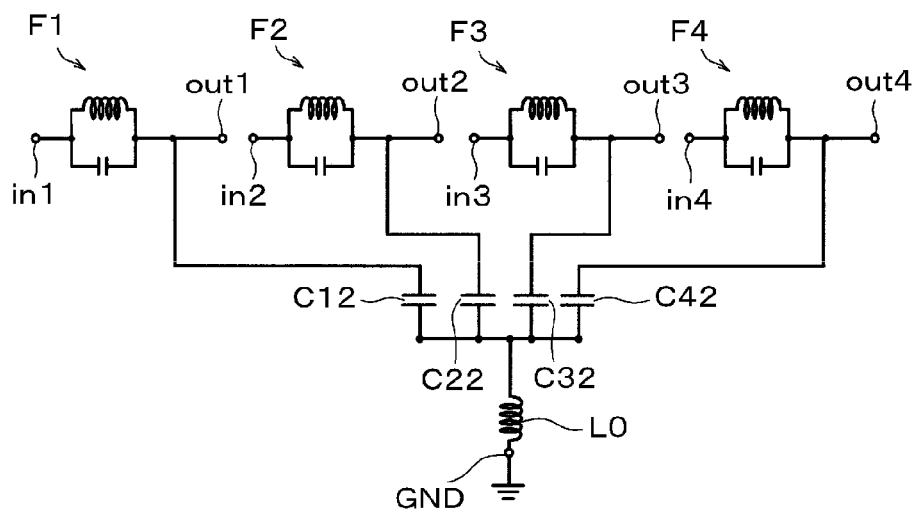
FIG. 12 is an electrical equivalent circuit diagram showing a noise filter array resulting from sharing of a capacitor and a coil in order to simplify the configuration in FIG. 11.

FIG. 9 is an exploded perspective view of a noise filter array according to a third preferred embodiment of the present invention. The components in FIG. 9 having the same reference numerals as in FIGS. 1 to 4 show the same components as in the configuration of the first preferred embodiment or show the corresponding components of the first preferred embodiment.

In the noise filter array of the third preferred embodiment, the inductance adjustment conductors L12 and L42 and the signal-side electrodes 8 of the capacitors C12 and C42, which define the respective LC series resonant circuits SR1 and SR4, are integrally provided on substantially the same plane, that is, on a single insulating sheet 6, and the inductance adjustment conductors L22 and L32 and the signal-side electrodes 8 of the capacitors C22 and C32, which define the respective LC series resonant circuits SR2 and SR3, are integrally provided on substantially the same plane, that is, on a single insulating sheet 6. In the noise filter array of the third preferred embodiment, the two filter elements F2 and F3 are integrally provided on one side of the ground electrode 9 in the thickness direction (the layering direction) and the remaining two filter elements F1 and F4 are integrally provided on the other side of the ground electrode 9 in the thickness direction (the layering direction), as in the first preferred embodiment.

Integrally providing the inductance adjustment conductors L12 and L42 and the signal-side electrodes 8 of the capacitors on one insulating sheet 6 in advance and integrally providing the inductance adjustment conductors L22 and L32 and the signal-side electrodes 8 of the capacitors on one insulating sheet 6 in advance as in the third preferred embodiment enables the inductance adjustment conductors L12 to L42 to be connected to the signal-side electrodes 8 without the via holes 7, so that the number of the used insulating sheets 6 can be decreased so as to reduce the cost.

Since the remaining configuration, advantages, and effects are similar to those in the first preferred embodiment shown in FIGS. 1 to 4, a detailed description of them is omitted herein in order to avoid the duplication.

Although the two filter elements F2 and F3 are preferably arranged on one side of the ground electrode 9 in the thickness direction (the layering direction) and the remaining two filter elements F1 and F4 are preferably arranged on the other side of the ground electrode 9 in the thickness direction (the layering direction) in the first to third preferred embodiments, the filter elements may be provided only on one side of the ground electrode 9 in the thickness direction (layering direction), if needed. This can decrease the overall thickness of the noise filter array.

Although the inductance adjustment conductors L12 and L42 are preferably provided on one insulating sheet 6 and the inductance adjustment conductors L22 and L32 are preferably provided on one insulating sheet 6 in the first to third preferred embodiments, the noise filter array may be configured such that the inductance adjustment conductors L12 to L42 have helical shapes across at least two of the plurality of insulating sheets 6 and the inductance adjustment conductors L12 to L42 are connected to one another through the via holes 7. With such a configuration, since the inductances of the LC series resonant circuits SR1 to SR4 can be increased, the frequencies of the LC series resonant circuits SR1 to SR4 can be further decreased.

Fourth Preferred Embodiment

Figure 13:
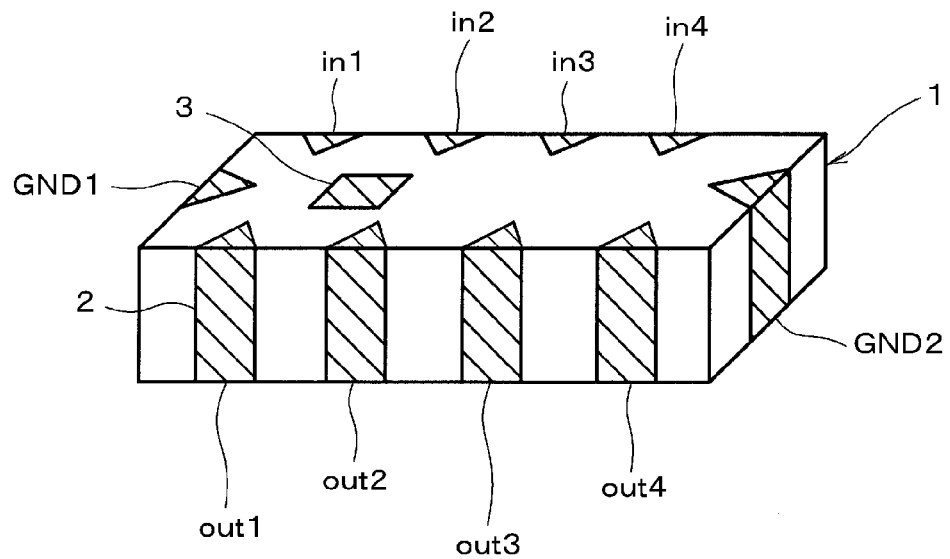
FIG. 13 is a perspective view showing the appearance of a noise filter array according to a fourth preferred embodiment of the present invention.
Figure 14:
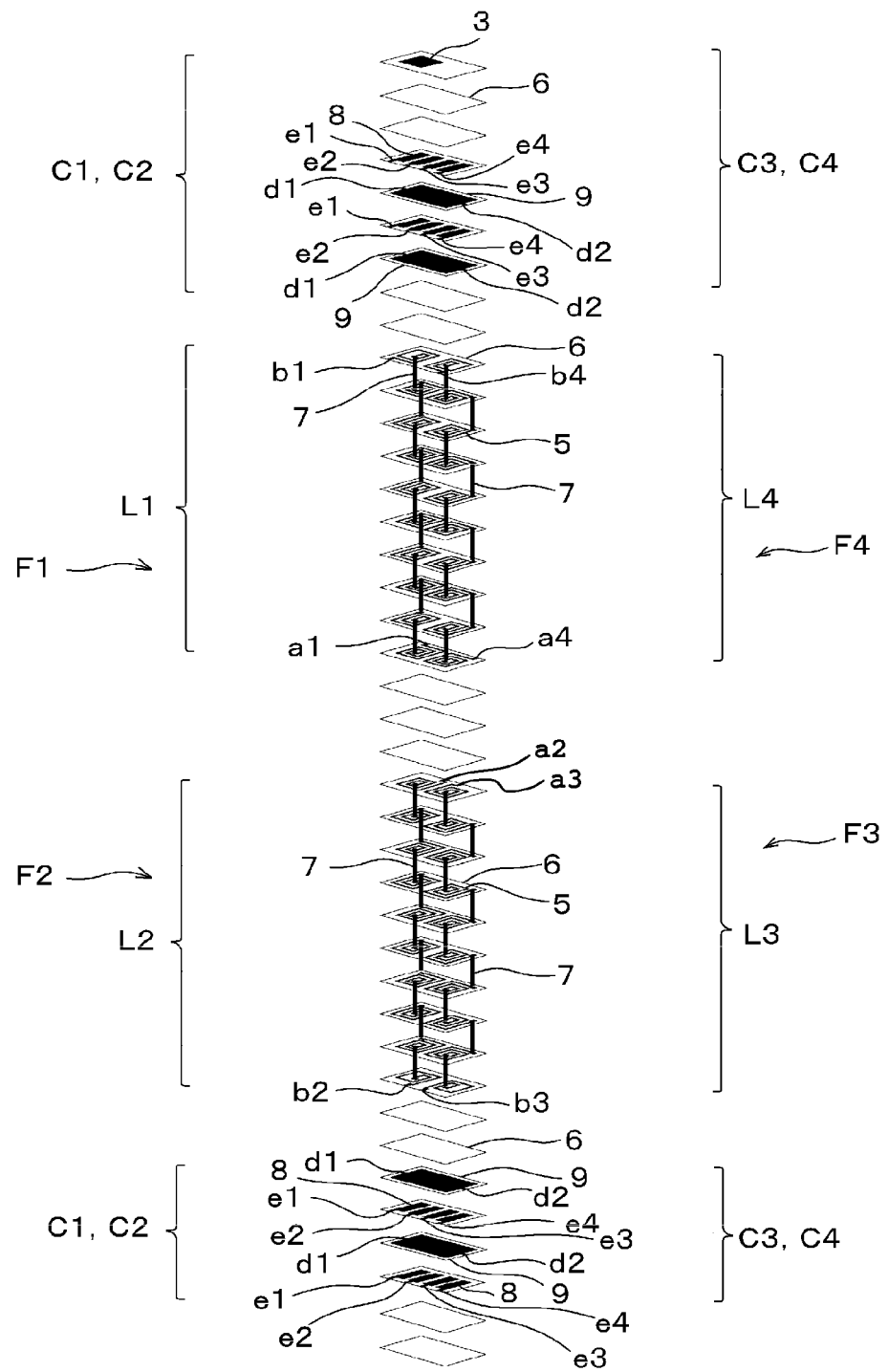
FIG. 14 is an exploded perspective view of the noise filter array according to the fourth preferred embodiment of the present invention.
Figure 15:
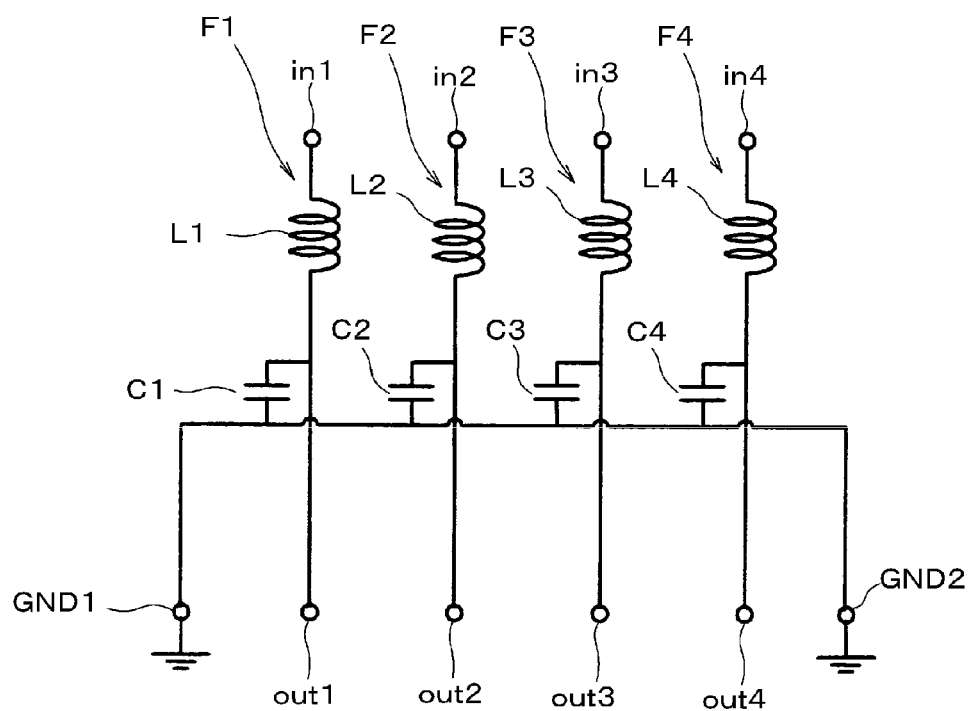
FIG. 15 is an electrical equivalent circuit diagram of the noise filter array according to the fourth preferred embodiment of the present invention.

FIG. 13 is a perspective view a noise filter array according to a fourth preferred embodiment of the present invention. FIG. 14 is an exploded perspective view of the noise filter array. FIG. 15 is an electrical equivalent circuit diagram of the noise filter array.

The noise filter array of the fourth preferred embodiment preferably has a substantially rectangular parallelepiped multilayer body 1 in which substantially rectangular insulating sheets preferably made of a ceramic dielectric material, such as barium titanate, or a ceramic magnetic material, such as ferrite, for example, are layered and are integrally fired. External electrodes 2 are provided on the side surfaces of the multilayer body 1. Of the external electrodes 2 provided on the front and rear surfaces along the longer sides, the external electrodes 2 on one surface define input terminals in1 to in4 of signals and the external electrodes 2 on the other surface define output terminals out1 to out4 of signals. The external electrodes 2 on the left-side and right-side surfaces along the shorter sides define ground terminals GND1 and GND2.

A directional identification mark 3 is preferably arranged at a location slightly displaced from the approximate center of the top surface of the multilayer body 1. The directional identification mark 3 is provided to identify the mounting direction of the noise filter array on a circuit board.

In the multilayer body 1, four filter elements F1 to F4, for example, are integrally provided with one another so as to correspond to the four input terminals in1 to in4 and the four output terminals out1 to out4. Specifically, the two filter elements F1 and F2 are arranged in proximity in the layering direction and the two filter elements F3 and F4 are arranged in proximity in the layering direction. The two filter elements F1 and F4 are provided in parallel in the direction substantially perpendicular to the thickness direction and the two filter elements F2 and F3 are provided in parallel in the direction substantially perpendicular to the thickness direction.

The filter elements F1 to F4 include coils L1 to L4 and capacitors C1 to C4, respectively, each defining an LC filter. Each of the coils L1 to L4 have a substantially helical shape by layering multiple insulating sheets (insulating layers) 6 on which spiral coil conductors 5 are provided and electrically connecting the coil conductors 5 on the layers via via holes 7. Of the coils defining the filter elements F1 and F2 and the filter elements F4 and F3 provided in the layering direction, the coils L1 and L2 are overlapped with each other so as to be adjacent to each other with insulating sheets 6 sandwiched therebetween and the coils L4 and L3 are overlapped with each other so as to be adjacent to each other with insulating sheets 6 sandwiched therebetween.

The capacitors C1 to C4 defining the filter elements F1 to F4 are arranged above and below the coils L1 to L4 in the layering direction with insulating sheets 6 sandwiched between the capacitors C1 to C4 and the filter elements F1 to F4. Each of the capacitors C1 to C4 is configured such that the insulating sheets 6 on which signal-side electrodes 8 are provided and the insulating sheets 6 on which ground electrodes 9 are provided are alternately arranged in the layering direction. The ground electrodes 9 are commonly provided for the double-resonance filter elements F1 to F4. Accordingly, the noise filter array of the fourth preferred embodiment has a substantially symmetrical configuration in the layering direction.

First ends a1 to a4 of the coil conductors 5 defining the coils L1 to L4 are connected to the external electrodes 2 composing the input terminals in1 to in4 of the multilayer body 1, respectively, and second ends b1 to b4 of the coil conductors 5 are connected to the external electrodes 2 defining the output terminals out1 to out4 of the multilayer body 1, respectively.

In addition, first ends e1 to e4 of the signal-side electrodes 8 defining the capacitors C1 to C4 are connected to the external electrodes 2 defining the output terminals out1 to out4 of the multilayer body 1, respectively. Furthermore, first ends d1 of the ground electrodes 9 are connected to the external electrode 2 defining one ground terminal GND1 of the multilayer body 1, and the second ends d2 of the ground electrodes 9 are connected to the external electrode 2 defining the other ground terminal GND2 of the multilayer body 1.

Accordingly, although the capacitors C1 to C4 are provided in the respective filter elements F1 to F4 in the electrical equivalent circuit diagram shown in FIG. 15, the six capacitors electrically connected to one another in parallel define one capacitor for each of the filter elements F1 to F4 in the actual noise filter array shown in FIG. 14.

During the manufacture of the noise filter array having the above-described configuration, the coil conductors 5, the signal-side electrodes 8 and the ground electrodes 9 of the ground capacitors C12 to C42, and the directional identification mark 3 are formed on the insulating sheets 6. The coil conductors 5, the signal-side electrodes 8 and the ground electrodes 9 of the ground capacitors C12 to C42, and the directional identification mark 3 are formed by applying a conductive paste preferably including Ag, Pd, Cu, Au, or their alloy as a conductive component, for example, by screen printing, for example. The via holes 7 are preferably formed by forming through holes using, for example, laser beams and filling the through holes with the conductive paste preferably including Ag, Pd, Cu, Au, or their alloy as a conductive component, for example.

The insulating sheets 6 on which the conductors, the electrodes, the via holes, and other elements are formed in the manner shown in FIG. 14 are layered and are subjected to pressure bonding to manufacture the multilayer body 1. Then, after the external electrodes 2 defining the input terminals in1 to in4, the output terminals out1 to out4, and the ground terminals GND1 and GND2 are formed on the side surfaces of the multilayer body 1, the multilayer body 1 is fired. After the multilayer body 1 is fired, the surface of each of the external electrodes 2 is preferably plated with Ni or Sn, for example. As a result, the substantially rectangular parallelepiped noise filter array having the configuration shown in FIG. 13 is manufactured.

As described above, the capacitors C1 to C4 including the ground electrodes 9 and the signal-side electrodes 8 having larger electrode areas are arranged on the upper and lower external sides of the coils L1 and L2, which are adjacent to each other in the layering direction, and the coils L4 and L3, which are adjacent to each other in the layering direction, in the noise filter array of the fourth preferred embodiment. Accordingly, gas from the binder can be easily discharged during degreasing and firing of the capacitors C1 to C4. Therefore, delamination can be effectively prevented. Delamination is a phenomenon in which the insulating sheets 6 separate from one another.

In addition, since the capacitors C1 to C4 are provided outside the coils L1 to L4, the distance from the bottom surface of the multilayer body 1 to the coils L1 to L4 is increased and an occurrence of breakage of the coils L1 to L4 can be prevented or suppressed even if a crack occurs due to shock, for example, when the circuit board on which the noise filter array is mounted is dropped or bent. Furthermore, since the noise filter array has a substantially symmetrical configuration in the layering direction, in which the filter elements F1 and F4 are arranged in the upper direction and the filter elements F2 and F3 are arranged in the lower direction, variations in the characteristics between the filter elements F1 to F4 is reduced and variations in the insertion loss characteristics can also be reduced.

Figure 16A:
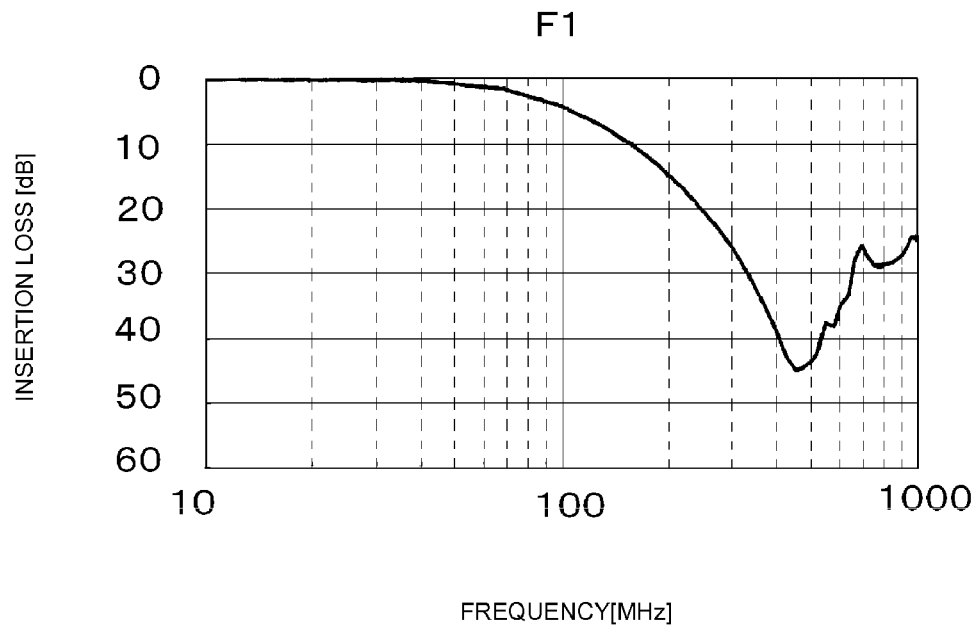
FIGS. 16A and 16B are characteristics diagrams showing the results of a measurement of the insertion loss characteristics of filter elements F1 and F2, respectively, in the noise filter array according to the fourth preferred embodiment of the present invention.
Figure 16B:
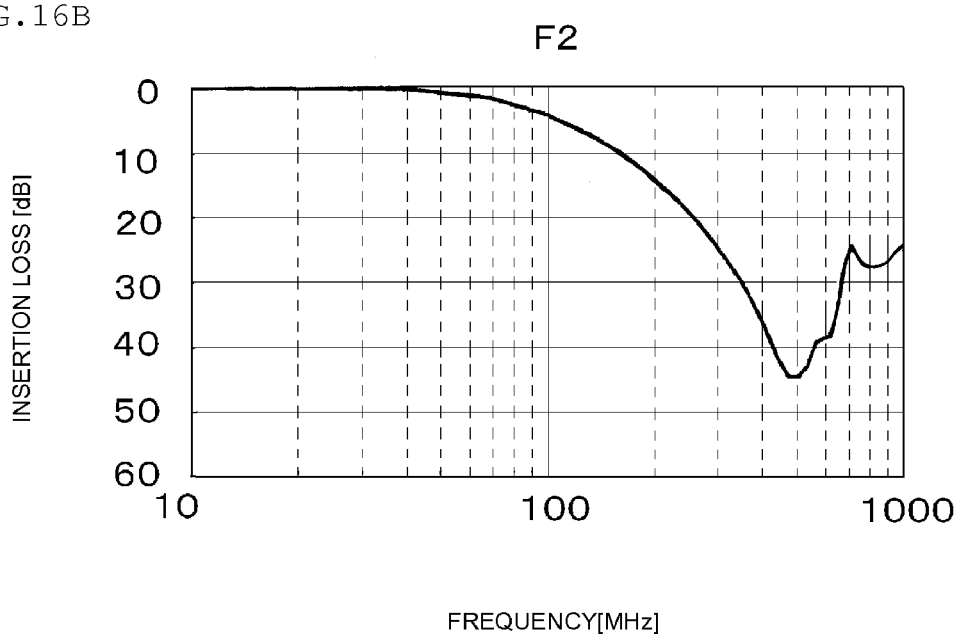
Figure 17A:
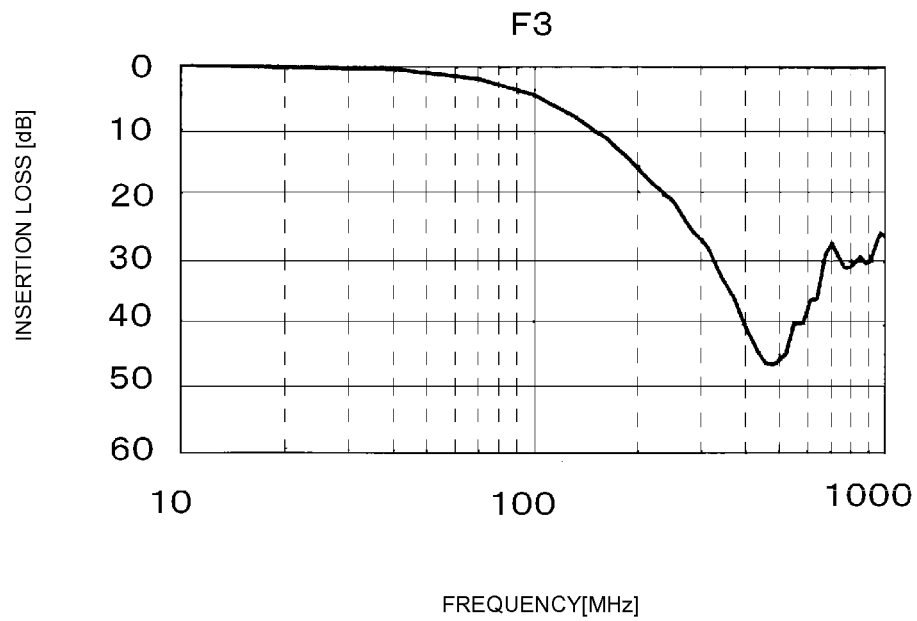
FIGS. 17A and 17B are characteristics diagrams showing the results of a measurement of the insertion loss characteristics of filter elements F3 and F4, respectively, in the noise filter array according to the fourth preferred embodiment of the present invention.
Figure 17B:
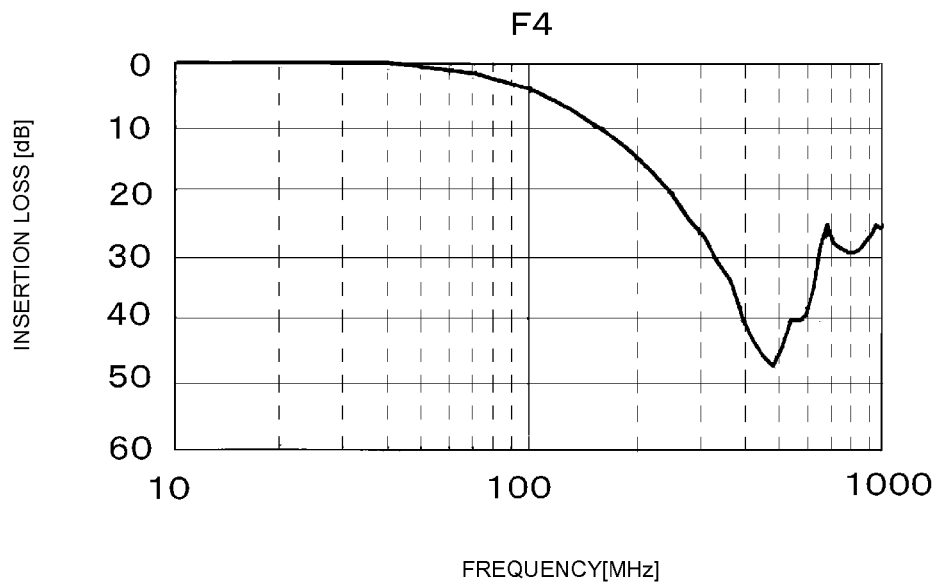

FIGS. 16A and 16B are characteristics diagrams showing the results of a measurement of the insertion loss characteristics of the filter elements F1 and F2, respectively, in the noise filter array according to the fourth preferred embodiment. FIGS. 17A and 17B are characteristics diagrams showing the results of a measurement of the insertion loss characteristics of the filter elements F3 and F4, respectively, in the noise filter array according to the fourth preferred embodiment.

FIGS. 16A and 16B and FIGS. 17A and 17B show that the filter elements F1 to F4 have approximately the same insertion loss characteristics.

The rate at which delamination occurs in the firing in the noise filter array of the fourth preferred embodiment and in a noise filter array having a configuration shown in FIG. 18 (hereinafter referred to as a comparative example) were examined. The results of the comparison are shown in Table 1.

In addition, the results of the examination of the inductances (L values) of the filter elements F1 to F4 in the noise filter array of the fourth preferred embodiment and in the comparative example are shown in Table 2. The results of the examination of the electrostatic capacitances of the filter elements F1 to F4 in the noise filter array of the fourth preferred embodiment and in the comparative example are shown in Table 3.

TABLE 1

|  | Rate of occurrence of delamination (%) |
| --- | --- |
| Fourth embodiment | 0 |
| Comparative example | 7 |

TABLE 2

| | Inductance of each filter element (nH) | | | |
| --- | --- | --- | --- | --- |
| | F1 | F2 | F3 | F4 |
| Fourth embodiment | 136 | 133 | 132 | 137 |
| Comparative example | 139 | 135 | 136 | 138 |

TABLE 3

| | Electrostatic capacitance of each filter element (pF) | | | |
| --- | --- | --- | --- | --- |
| | F1 | F2 | F3 | F4 |
| Fourth embodiment | 82 | 83 | 82 | 81 |
| Comparative example | 81 | 82 | 81 | 83 |

Figure 18:
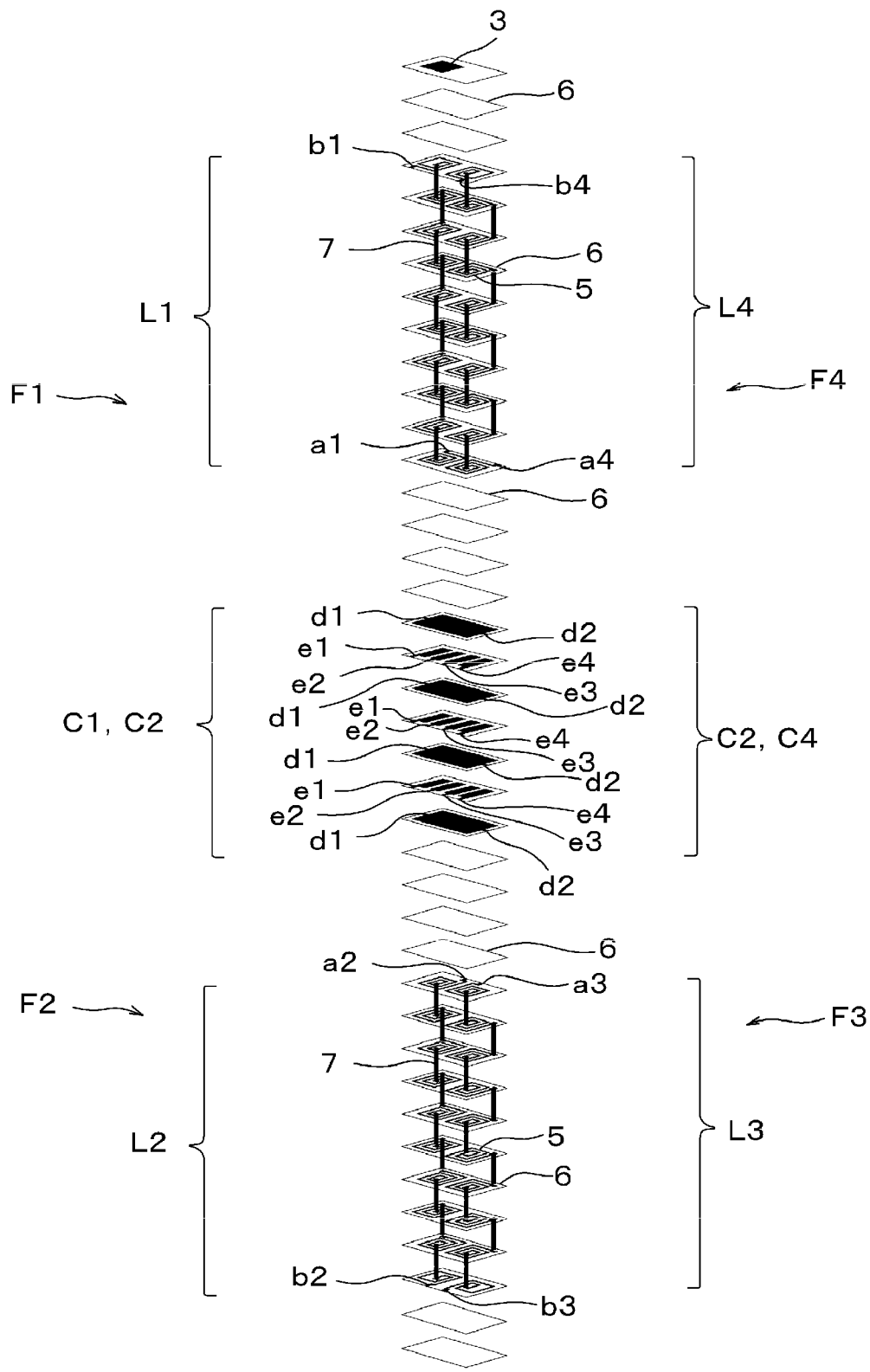
FIG. 18 is an exploded perspective view showing an example of a noise filter array used for comparison of the characteristics with the noise filter array of the fourth preferred embodiment of the present invention.

The noise filter array in the comparative example in FIG. 18 is configured such that the capacitors C1 to C4 are arranged inside the upper coils L1 and L4 and the lower coils L2 and L3 in the layering direction. The number of the layered insulating sheets 6 on which the signal-side electrodes 8 are provided is equal to four in the fourth preferred embodiment and the number of the layered insulating sheets 6 on which the signal-side electrodes 8 are formed is equal to three in the comparative example, which is one less than that in the fourth preferred embodiment. In contrast, the number of capacitors along the layering direction, arranged of the signal-side electrodes 8 and the ground electrodes 9, is equal to six in both of the examples.

As shown in Table 1, the rate of occurrence of delamination in the fourth preferred embodiment is 0% because the capacitors C1 to C4 having a greater electrode area are arranged outside the coils L1 to L4. In contrast, the rate of occurrence of delamination in the comparative example is relatively high because the capacitors C1 to C4 are arranged inside the coils L1 to L4. Accordingly, the noise filter array of the fourth preferred embodiment is superior to the one in the comparative example.

Tables 2 and 3 show that the filter elements F1 to F4 have approximately the same inductance and electrostatic capacitance in the fourth preferred embodiment and in the comparative example and the variation between the elements is relatively small.

Fifth Preferred Embodiment

Figure 19:
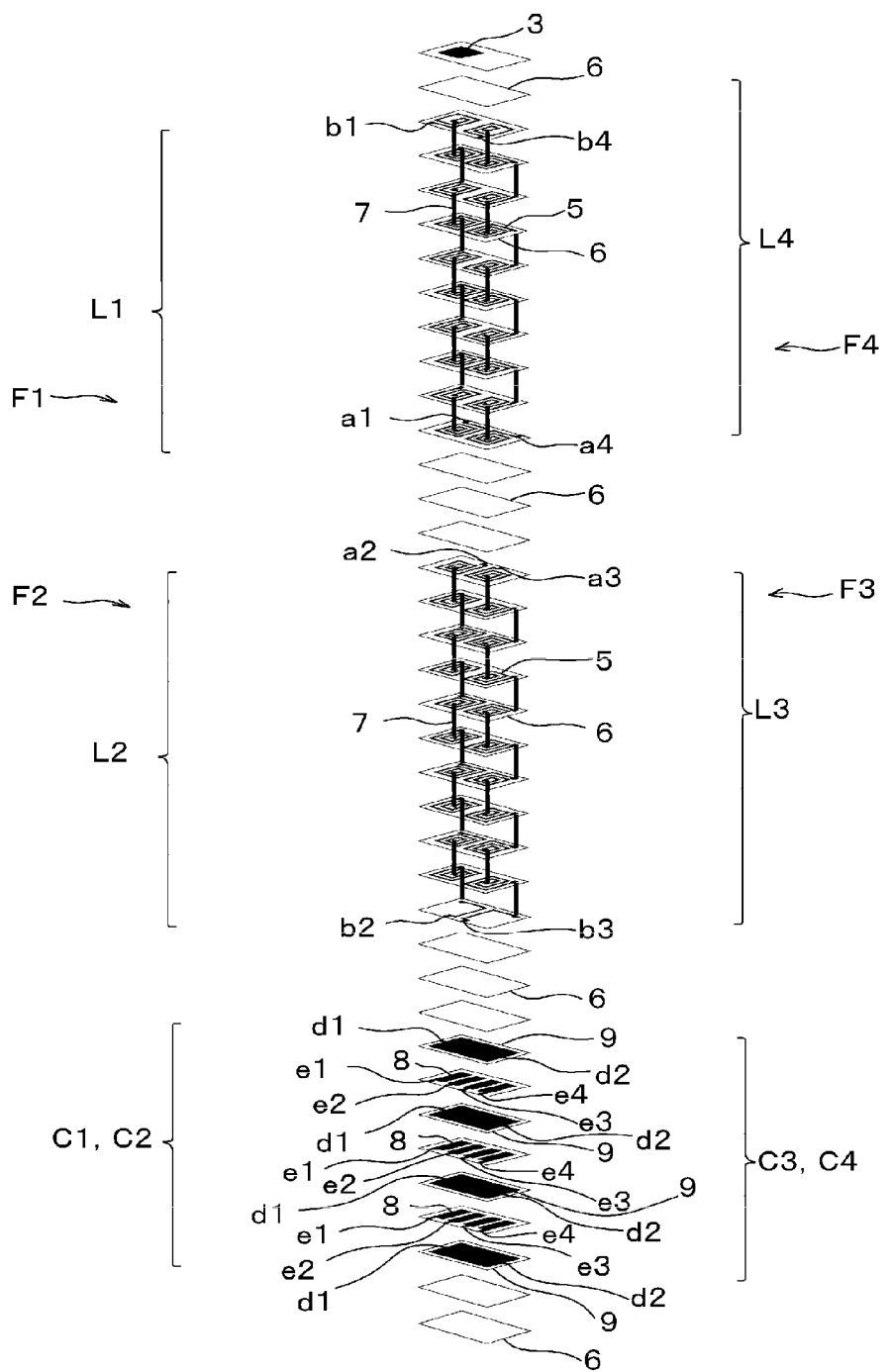
FIG. 19 is an exploded perspective view of a noise filter array according to a fifth preferred embodiment of the present invention.

FIG. 19 is an exploded perspective view of a noise filter array according to a fifth preferred embodiment of the present invention. The components in FIG. 19 having the same reference numerals as in FIG. 14 show the same components as in the configuration of the fourth preferred embodiment or show the corresponding components of the fourth preferred embodiment.

In the noise filter array of the fifth preferred embodiment, the four filter elements F1 to F4, for example, are integrally provided with one another. The noise filter array of the fifth preferred embodiment is similar to the noise filter array of the fourth preferred embodiment in that the two filter elements F1 and F2 are arranged in proximity in the layering direction, the two filter elements F3 and F4 are arranged in proximity in the layering direction, the two filter elements F1 and F4 are provided in parallel in the direction substantially perpendicular to the thickness direction, and the two filter elements F2 and F3 are provided in parallel in the direction substantially perpendicular to the thickness direction.

The noise filter array of the fifth preferred embodiment differs significantly from the noise filter array of the fourth preferred embodiment in that the capacitors C1 to C4 in the filter elements F1 to F4 are collectively arranged on one side (the lower side in FIG. 19) of the coils L1 to L4 in the layering direction.

In addition, of the coils L1 to L4, the number of the layered insulating sheets 6 on which the coil conductors 5 are provided in the coils L2 and L3 near the capacitors C1 to C4 is greater than that in the coils L1 and L4, which are provided above the coils L2 and L3. As a result, the coils L2 and L3 near the capacitors C1 to C4 are configured such that the winding length of the coil conductors 5 is greater than that in the upper coils L1 and L4.

This configuration is preferably used because the upper and lower coils have approximately the same inductance and the variations in the characteristics between the filter elements F1 to F4 are reduced. Specifically, since no electrode for capacitor formation interrupting the magnetic flux is provided for the upper coils L1 and L4, the coils L1 and L4 have higher inductances than those of the lower coils L2 and L3. Accordingly, the increase in the winding length of the coil conductors 5 in the lower coils L2 and L3 has the advantage in that the upper coils have approximately the same inductance as that of the lower coils and the variations in the characteristics between the filter elements F1 to F4 are reduced.

First ends a1 to a4 of the coil conductors 5 defining the coils L1 to L4 are connected to the external electrodes 2 defining the input terminals in1 to in4 of the multilayer body 1, respectively, and the second ends b1 to b4 of the coil conductors 5 are connected to the external electrodes 2 defining the output terminals out1 to out4 of the multilayer body 1, respectively.

In addition, first ends e1 to e4 of the signal-side electrodes 8 defining the capacitors C1 to C4 are connected to the external electrodes 2 defining the output terminals out1 to out4 of the multilayer body 1, respectively. Furthermore, first ends d1 of the ground electrodes 9 are connected to the external electrode 2 defining one ground terminal GND1 of the multilayer body 1, and the second ends d2 of the ground electrodes 9 are connected to the external electrode 2 defining the other ground terminal GND2 of the multilayer body 1.

Accordingly, the ground electrodes 9 of the capacitors C1 to C4 are commonly provided for the filter elements F1 to F4 and are arranged so as to cover the area in which the coils L1 to L4 are provided in the fifth preferred embodiment. Consequently, the stray capacitance between the coils L1 to L4 and the external electrodes 2 at the ground side is suppressed, such that the variations in the IL characteristics can be reduced.

In addition, in the noise filter array of the fifth preferred embodiment, since the capacitors C1 to C4 having greater electrode areas are arranged on one side of the coils L1 to L4 and L3 in the layering direction, gas from the binder can be easily discharged during degreasing and firing of the capacitors C1 to C4 and, therefore, delamination is effectively prevented.

In addition, since the capacitors C1 to C4 are provided outside the coils L1 to L4, the distance from the bottom surface of the multilayer body 1 to the coils L1 to L4 is increased, provided that the surface of the multilayer body 1 on which the capacitors C1 to C4 are provided is the mounting surface, and an occurrence of breakage of the coils L1 to L4 can be prevented even if a crack occurs due to shock, for example, when the circuit board on which the noise filter array is mounted is dropped or bent. It is particularly preferable to provide the directional identification mark 3 on a surface of the multilayer body 1 in the configuration of the fifth preferred embodiment because the mounting surface on which the capacitors C1 to C4 are provided can be easily identified.

The results of an examination of the rate of occurrence of the delamination in the firing in the noise filter array of the fifth preferred embodiment are shown in Table 4. In addition, the results of an examination of the inductances (L values) of the filter elements F1 to F4 in the noise filter array of the fifth preferred embodiment is shown in Table 5. The results of an examination of the electrostatic capacitances of the filter elements F1 to F4 in the noise filter array of the fifth preferred embodiment is shown in Table 6.

TABLE 4

| | Rate of occurrence of delamination (%) |
| --- | --- |
| Fifth embodiment | 0 |

TABLE 5

| | Inductance of each filter element (nH) | | | |
| --- | --- | --- | --- | --- |
| | F1 | F2 | F3 | F4 |
| Fifth embodiment | 150 | 142 | 144 | 151 |

TABLE 6

| | Electrostatic capacitance of each filter element (pF) | | | |
| --- | --- | --- | --- | --- |
| | F1 | F2 | F3 | F4 |
| Fifth embodiment | 79 | 84 | 83 | 80 |

As shown in Table 4, the rate of occurrence of delamination in the fifth preferred embodiment is 0% because the capacitors C1 to C4 having a greater electrode area are arranged outside the coils L1 to L4. Tables 5 and 6 shows that the filter elements F1 to F4 have approximately the same inductance and electrostatic capacitance and the variation between the elements is relatively small.

Since the remaining configuration, advantages, and effects are similar to those in the fourth preferred embodiment shown in FIGS. 13 to 15, a detailed description of them is omitted herein in order to avoid the duplication.

Although the noise filter arrays including the four filter elements F1 to F4 are described in the first to fifth preferred embodiments, the present invention is not limited to this configuration and is widely applicable to any noise filter array including a plurality of filter elements.

In addition, the situation in which the individual components shown in FIGS. 1 and 13 are separately produced are described in the first to fifth preferred embodiments. However, in mass production, after a mother multilayer body in which multiple multilayer bodies are integrated with one another is manufactured, the mother multilayer body may be cut so that the multilayer body 1 shown in FIG. 1 or 13 is obtained to manufacture the individual elements.

In addition, the insulating sheets 6 on which the coil conductors 5, the signal-side electrodes 8, the ground electrodes 9, the via holes 7, and other elements are provided are layered and, then, the insulating sheets 6 are integrally fired in the first to fifth preferred embodiments described above. However, the insulating sheets 6 that are fired in advance may be layered and subjected to pressure bonding to manufacture the multilayer body 1.

Furthermore, the formation of the insulating layers by applying an insulating material and the formation of the conductors by applying a conductive material may be sequentially repeated for recoating to manufacture the noise filter array having a layered configuration. For example, a paste insulating material is preferably applied by printing, for example, to form the insulating layers, a paste conductive material is applied on the insulating layers to form the coil conductors 5, the signal-side electrodes 8, and the ground electrodes 9, the via holes 7 are formed if needed, and a paste insulating material is applied on the coil conductors 5, the signal-side electrodes 8, and the ground electrodes 9 to form the insulating layers.

Although the filter elements F1 to F4 include the LC parallel resonant circuits PR1 to PR4 and the LC series resonant circuits SR1 to SR4, respectively, in the noise filter arrays of the first to third preferred embodiments and the filter elements F1 to F4 include the LC filters in the noise filter arrays of the fourth and fifth preferred embodiments, the present invention is not restricted to these configurations. For example, preferred embodiments of the present invention are applicable to a noise filter array in which multiple π-shaped filter elements, T-shaped filter element, or LCR ladder filter elements, for example, each including a resistor R are provided in proximity in an array form to be integrally provided with one another.

The present invention is not restricted to the above-described preferred embodiments in other points and various applications and modifications may occur insofar as they are within the scope of the invention.

According to preferred embodiments of the present invention, it is possible to obtain a noise filter array having small variations in characteristics between multiple filter elements with a simple configuration.

Accordingly, it is possible to use the noise filter array of preferred embodiments of the present invention in a wide variety of applications, such as a noise filter to suppress the noise within each communication band in one mobile phone using multiple communication bands.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A noise filter array comprising:
a plurality of filter elements provided in proximity in an array and integrally provided with one another, each of the plurality of filter elements including an LC parallel resonant circuit including a coil and a capacitor and an LC series resonant circuit including a coil and a ground capacitor; wherein
each of the ground capacitors includes a signal-side electrode;
the coil of each of the LC series resonant circuits defines an inductance adjustment conductor that is connected to the signal-side electrode of the ground capacitor of each of the LC series resonant circuits; and
the ground capacitors include a ground electrode commonly arranged for the signal-side electrodes so as to oppose the signal-side electrodes.

2. The noise filter array according to claim 1, wherein inductances of the inductance adjustment conductors are individually set in accordance with a signal frequency within a communication band.

3. The noise filter array according to claim 1, wherein each of the inductance adjustment conductors has one of a meander shape, a spiral shape, or a coil shape.

4. The noise filter array according to claim 1, wherein each of the inductance adjustment conductors is connected to a respective one of the signal-side electrodes of the ground capacitors through a via hole.

5. The noise filter array according to claim 1, wherein the inductance adjustment conductors and the signal-side electrodes of the ground capacitors, which define the LC series resonant circuits, are integrally provided on substantially the same plane.

6. The noise filter array according to claim 1, wherein the noise filter array has a layered configuration in which the plurality of filter elements are provided on both sides in the layering direction of the ground electrode which is commonly provided for the signal-side electrodes of the ground capacitors.

7. The noise filter array according to claim 6, wherein the noise filter array has a layered configuration in which two elements among the plurality of filter elements are provided on one side of the ground electrode of the ground capacitors in the layering direction and two elements among the plurality of filter elements are provided on the other side of the ground electrode of the ground capacitors in the layering direction.

8. The noise filter array according to claim 1, wherein the noise filter array has a layered configuration in which the plurality of filter elements are provided on only one side of the ground electrode of the ground capacitors in the layering direction.

9. The noise filter array according to claim 1, wherein locations of conductors which define coils of the LC parallel resonant circuit and the LC series resonant circuit are shifted such that the conductors are not overlapped with one another in a thickness direction.

10. A noise filter array comprising:
a plurality of filter elements provided in proximity in an array and integrally provided with one another, each of the plurality of filter elements including a coil in which a plurality of insulating layers having coil conductors provided thereon are layered and a capacitor in which one of the plurality of insulating layers having a signal-side electrode provided thereon and one of the plurality of insulating layers having a ground electrode provided thereon are layered, the coil being arranged in proximity to the capacitor in a layering direction and the coil being electrically connected to the capacitor; wherein the plurality of filter elements are arranged along the layering direction of the insulating layers such that at least one of the plurality of filter elements is disposed above at least another one of the plurality of filter elements in the layering direction of the insulating layers, and the plurality of filter elements arranged along the layering direction are overlapped with one another such that the coils are adjacent to one another; and the capacitors are arranged on at least one external side in the layering direction so as not to be sandwiched between the coils.

11. The noise filter array according to claim 10, wherein an even number of the plurality of filter elements are arranged along the layering direction; and approximately half of the plurality of filter elements are arranged in an upper side in the layering direction and approximately the other half of the plurality of filter elements are arranged in a lower side in the layering direction so as to have a substantially symmetrical configuration in the layering direction.

12. The noise filter array according to claim 10, wherein the capacitors of the plurality of filter elements along the layering direction are collectively arranged on one side of the coils in the layering direction.

13. The noise filter array according to claim 12, wherein the ground electrodes of the capacitors are shared between the plurality of filter elements and are arranged so as to cover an area in which the coils are provided.

14. The noise filter array according to claim 13, wherein, of adjacent ones of the coils of each of the plurality of filter elements, the coil near the capacitors is arranged so as to have a winding length of the coil conductors greater than that of the other coils.

15. The noise filter array according to claim 12, wherein a side at which the capacitors are arranged outside in the layering direction is a mounting surface side.

16. The noise filter array according to claim 10, wherein a directional identification mark is provided on an outermost insulating layer in the layering direction.

17. A noise filter array comprising:

a plurality of filter elements provided in proximity in an array and integrally provided with one another, each of the plurality of filter elements including an LC parallel resonant circuit including a coil and a capacitor and an LC series resonant circuit including a coil and a ground capacitor; wherein each of the ground capacitors includes a signal-side electrode;

the coil of each of the LC series resonant circuits defines an inductance adjustment conductor that is arranged to adjust an inductance of the LC series resonant circuit;

one end of each of the inductance adjustment conductors is connected to one of the LC parallel resonant circuits, and the other end of each of the inductance adjustment conductors is connected to the signal-side electrode of the ground capacitor of one of the LC series resonant circuits;

the ground capacitors include a ground electrode commonly arranged for the signal-side electrodes so as to oppose the signal-side electrodes, and the coils of the LC parallel resonant circuits and the inductance adjustment conductors of the LC series resonant circuits are defined by a multilayer body in which a plurality of insulating layers having coil conductors provided thereon are layered;

two of the plurality of filter elements are arranged on one side of the ground electrode in a layering direction and two of the plurality of filter elements are arranged on the other side of the ground electrode in the layering direction; and each of the coils of the LC parallel resonant circuits is electrically connected to one of the inductance adjustment conductors via an external electrode provided on an outer side of the multilayer body.

18. The noise filter array according to claim 17, wherein at least two of the plurality of insulating layers are layered between the coil of one of the LC parallel resonant circuits and one of the inductance adjustment conductors.

19. The noise filter array according to claim 17, wherein the inductances of the inductance adjustment conductors are individually set in accordance with a signal frequency of a communication band.

20. The noise filter array according to claim 17, wherein each of the inductance adjustment conductors has one of a meander shape, a spiral shape, or a coil shape.

21. The noise filter array according to claim 17, wherein each of the inductance adjustment conductors is connected to the signal-side electrode of one of the ground capacitors through a via hole.

22. The noise filter array according to claim 17, wherein the inductance adjustment conductor and the signal-side electrode of the ground capacitor of one of the LC series resonant circuits are integrally provided on substantially the same plane.

23. The noise filter array according to claim 17, wherein locations of conductors which define the coils of the LC parallel resonant circuit and the LC series resonant circuit are shifted such that the conductors are not overlapped with one another in a thickness direction.

* * * * *